(12) United States Patent
Tsu et al.

(10) Patent No.: US 6,194,292 B1
(45) Date of Patent: Feb. 27, 2001

(54) METHOD OF FABRICATING IN-SITU DOPED ROUGH POLYCRYSTALLINE SILICON USING A SINGLE WAFER REACTOR

(75) Inventors: Robert Yung-Hsi Tsu; Shintaro Aoyama, both of Plano, TX (US); Toshio Ando, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/378,688

(22) Filed: Aug. 20, 1999

Related U.S. Application Data
(60) Provisional application No. 60/097,454, filed on Aug. 21, 1998.

(51) Int. Cl.[7] ............................. H01L 21/20; H01L 21/36
(52) U.S. Cl. ......................... 438/488; 438/478; 438/964
(58) Field of Search .................................. 438/488, 478, 438/964; 427/255.1, 255.2, 97

(56) References Cited

U.S. PATENT DOCUMENTS

| | | | | |
|---|---|---|---|---|
| 5,080,933 | * | 1/1992 | Grupen-Shemansky | 427/255.1 |
| 5,607,724 | * | 3/1997 | Beinglass et al. | 427/255.1 |
| 5,783,257 | * | 7/1998 | Shishiguchi et al. | 427/255.2 |
| 5,863,598 | * | 1/1999 | Venkatesan et al. | 427/97 |

* cited by examiner

*Primary Examiner*—Richard Elms
*Assistant Examiner*—Bradley K Smith
(74) *Attorney, Agent, or Firm*—Peter K. McLarty; W. James Brady, III; Frederick J. Telecky, Jr.

(57) ABSTRACT

A method of fabricating in-situ doped rough polycrystalline silicon in a single process in a single wafer reactor is disclosed. The method includes substantially simultaneously flowing $SiH_4$, $PH_3$, and $H_2$ in the single wafer reactor under predetermined temperature and pressure conditions and gas flow rates that result in nucleation and growth of a rugged polycrystalline silicon.

4 Claims, 2 Drawing Sheets

METHOD OF FABRICATING IN-SITU DOPED ROUGH POLYCRYSTALLINE SILICON USING A SINGLE WAFER REACTOR

This application claims priority under 35 USC §119(e)(1) of the provisional application No. 60/097,454 filed Aug. 21, 1998.

TECHNICAL FIELD OF THE INVENTION

The present invention generally relates to semiconductor devices and methods of manufacture, and more particularly to a method of fabricating in-situ doped, rough polycrystalline silicon using a single wafer reactor.

BACKGROUND OF THE INVENTION

As semiconductor memory device dimensions continue to shrink, and the corresponding density continues to increase by a 4x rule, the storage cell gets increasingly smaller while the required storage charge remains about the same. Conventional oxynitride (N/O or O/N/O) dielectrics have a relatively low capacitance per unit area (~7.7 fF/um2, for an effective oxide thickness of 4.5 nm) that limits the storage capacity because of high tunneling leakage. To combat this problem, various area enhancement technique have been proposed, including hemispherical grain (HSG) or rough polysilicon film growth techniques, and disk, fin, and corrugated cylindrical cell (CCC) cell structures.

Storage cells that incorporate fins, disks, and CCC formations are primarily composed of multiple horizontal fins to add surface area. However, as the storage cell size is further decreased, the horizontal fins add less surface area than vertical sidewalls. Furthermore, the typical fin-type structure is a less robust structure that can more easily sustain damage during processing, especially during oxide and particle removal between the fins.

Storage cells incorporating roughened polysilicon have been proposed using thin film growth techniques including HSG, ion implementation, and native oxide promoted rough polysilicon growth. Little or no leakage penalty has been identified for the rough storage polysilicon cell structures as compared to the smooth polysilicon structures. However, these growth techniques involve depositing the rough polysilicon onto undoped polysilicon. Therefore, additional doping is required to avoid interfacial depletion, introducing a low capacitance layer coupled with N/O thin dielectrics. The HSG technique typically further requires multiple complex deposition and annealing steps performed within a relatively narrow deposition temperature window (less than or equal to about 5° C.). The rough polysilicon technique typically further requires native oxide as a base in order to form rough surfaces. In addition, currently, deposition of rough polycrystalline silicon is done in a vertical furnace and results in non-uniform deposition across a wafer and from wafer to wafer in a whole wafer load, i.e., approximately 100 wafers. Therefore, conventional HSG and rough polysilicon formation techniques do not provide a robust technology for manufacturing. As a result, a storage cell grown using conventional HSG or rough polysilicon techniques typically lacks desired mechanical strength and stability.

Gas phase nucleation has been used as a growth technique to deposit GaAs clusters for formation of quantum dots. Controlling the gas phase nucleation enables control of sizes of gas phase nucleated particles and surface morphology. A detailed description of gas phase nucleation kinetics is provided in the following references: "Gas-Phase Nucleation in GaAs Thin Film Preparation by Metal Organic Chemical Vapor Deposition," K. Okuyama, D. D. Huang, J. H. Seinfeld, N. Tani, and I. Mansui, Japan Journal of Applied Physics, Volume 31, pp 1–11 (1992); and "Lower-Dimensional Quantum Structures by Selective Growth and Gas-Phase Nucleation," K. J. Vahala, W. A. Saunders, C. S. Tsai, P. C. Sercel, T. Kuech, H. A. Atwater, and R. C. Flagan, Journal of Vacuum Science Technology, B11, 1660 (1993). Gas phase nucleation has typically been avoided in deposition of polysilicon due to resulting rough structure and particulate generation during the gas phase.

SUMMARY OF THE INVENTION

The present invention provides a method of fabricating polycrystalline silicon for use in a semiconductor memory device storage device that substantially eliminates or reduces disadvantages and problems associated with previously developed fabrication techniques.

More specifically, the present invention provides a method for fabricating polycrystalline silicon for use in a semiconductor memory device storage cell structure having an increased surface area. The method of the present invention is advantageously performed using a single process in a single wafer reactor under conditions that result in nucleation and growth of rough polycrystalline silicon. The method for forming rugged polycrystalline silicon comprises depositing in-situ doped rugged polycrystalline silicon on a substrate in a single wafer chemical vapor deposition chamber under predetermined temperature conditions and predetermined pressure conditions that result in nucleation and growth of a rugged polycrystalline silicon. The deposition comprises substantially simultaneously flowing $SiH_4$, $PH_3$ and $H_2$ into the single wafer reactor.

The present invention provides a technical advantage by increasing the surface area of a storage cell that employs the rough polycrystalline silicon. The method thereby increases the total capacitance per storage cell. The total capacitance of a storage cell using polycrystalline silicon fabricated using the method of the present invention can have two or more times the capacitance of a storage cell with smooth polysilicon surfaces.

The present invention provides another technical advantage in the use of a single wafer reactor that enables more precise control of the deposition conditions such as temperature, pressure and gas flow as compared to the furnace type reactor that is typically used to deposit rough polycrystalline silicon. The use of a single wafer reactor also improves deposition thickness uniformity from wafer to wafer as compared to the use of a furnace type reactor. Further, deposition takes place in a single step thus simplifying fabrication.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The method according to embodiments of the present invention utilizes a single wafer reactor to grow in-situ doped, rough polycrystalline silicon. The method according to embodiments of the present invention enables growth of rough polysilicon structure using primarily surface phase nucleation. The method also enables in-situ doping of the rough polycrystalline silicon and elimination of post deposition annealing. The resulting polycrystalline silicon provides an increased surface area to storage cells in which it is used.

Figure 1:
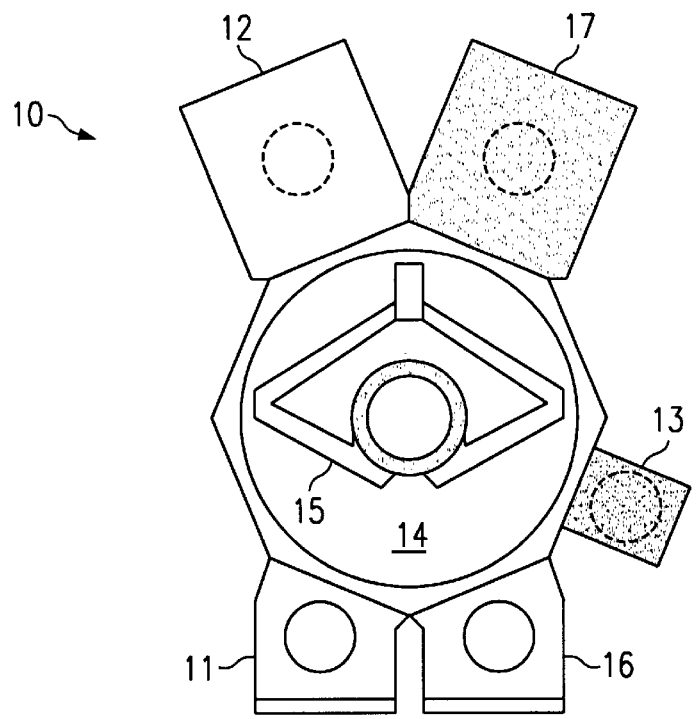
FIG. 1 schematically depicts a top view of a single wafer reactor used in conjunction with a method according to one embodiment of the present invention.

FIG. 1 schematically depicts a top view of a single wafer reactor 10 used in conjunction with a method according to one embodiment of the present invention. Single wafer reactor 10 comprises first loadlock chamber 11, first process chamber 12, cooling chamber 13, transfer chamber 14 including transfer arm 15, second loadlock chamber 16 and second process chamber 17. In one preferred embodiment, only first loadlock chamber 11 and first process chamber 12 are used to perform the method according to the present invention. In one embodiment, single wafer reactor 10 is the Centura 5500™ manufactured by Applied Materials™. In another embodiment, single wafer reactor 10 is any available single wafer reactor having at least one loadlock chamber, at least one process chamber and at least one cooling chamber.

A substrate upon which deposition is to take place is initially placed inside first loadlock chamber 11. Once inside first loadlock chamber 11, the interior of first loadlock chamber 11 is evacuated to minimize the possibility of contamination during deposition. After evacuation, the interior of loadlock chamber 11 is backfilled to the same pressure as transfer chamber 14. The substrate is then transferred through transfer chamber 14 into first process chamber 12 by transfer arm 15. Once the deposition substrate is inside, first process chamber 12 is sealed. The conditions (e.g., temperature and pressure) inside first process chamber 12 are then adjusted and deposition takes place by flowing the deposition gases through. When deposition is complete, the substrate is transferred to through transfer chamber 14 into cooling chamber 13 by transfer arm 15. Once the substrate is sufficiently cooled, it is transferred through transfer chamber 14 into first loadlock chamber 11. Loadlock chamber 11 is then backfilled to atmospheric pressure and the substrate is removed from reactor 10.

Figure 2:
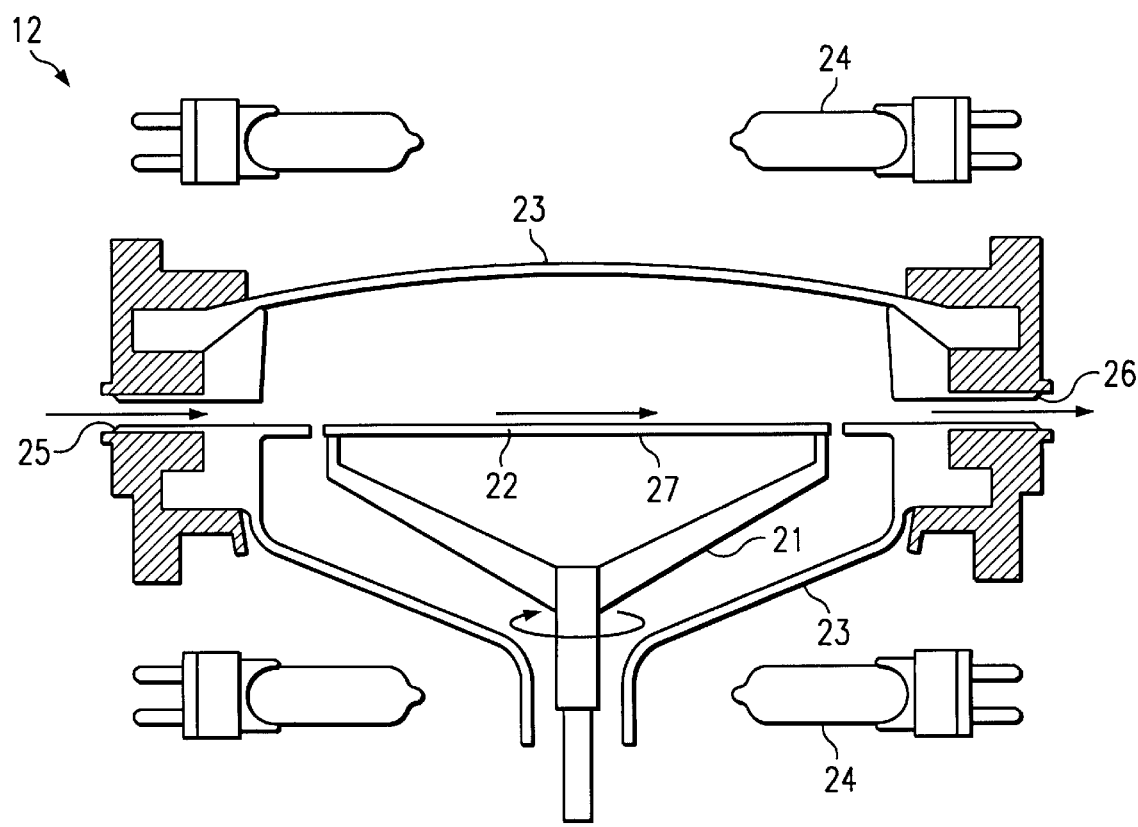
FIG. 2 schematically depicts a side view of process chamber A of the single wafer reactor depicted in FIG. 1.

A more specific aspect of the method of the present invention is the deposition that occurs in first process chamber 12. FIG. 2 schematically depicts a side view of first process chamber 12 of single wafer reactor 10. First process chamber 12 comprises substrate holder 21, susceptor 22, quartz dome 23, lamps 24, gas inlet 25, outlet 26 and pyrometer 27. When a substrate is transferred into process chamber 12 by transfer arm 15, it is placed on susceptor 22 for deposition. Susceptor 22 preferably comprises a good heat conductor to improve the temperature uniformity of the substrate. Quartz dome 23 is used to isolate process chamber 12 to maintain a low ambient pressure and is transparent so that radiation from lamps 24 reaches the substrate. Lamps 24 are positioned on the top and the bottom of process chamber 12 and provide a radiant heat source to heat the substrate. The deposition materials are flowed into process chamber 12 through gas inlet 25 and evacuated from process chamber 12 through outlet 26. Outlet 26 is connected to a vacuum pump to assist in the evacuation of process chamber 12 after deposition is complete. Pyrometer 27 measures the temperature at susceptor 22 and provides a signal that is used to control the power to lamps 24. The susceptor temperature is used for ease of measurement and calibration.

A method of fabricating in-situ doped, rough polycrystalline silicon using a single wafer reactor such as single wafer reactor 10 will now be explained with reference to FIGS. 1 and 2. Initially an appropriate substrate for the deposition is loaded into single wafer reactor to through loadlock chamber 11. According to one embodiment, amorphous silicon material is used as the substrate. In other embodiments, a single crystal wafer, polycrystalline silicon, $Si_3N_4$ and $SiO_2$ are used as the substrate. The substrate is then transferred to process chamber 12 within which deposition of rough polycrystalline silicon will take place.

The temperature at the susceptor and the pressure conditions inside process chamber 12 are then adjusted for deposition. The susceptor temperature is adjusted to be within a range that is between a temperature likely to lead to nucleation and a temperature likely to lead to growth. According to one embodiment, the susceptor temperature is adjusted to be between about 648° C. and about 688° C. In a preferred embodiment, the susceptor temperature is adjusted to be about 668° C. The pressure inside process chamber 12 is adjusted to be between about 20 Torr and about 40 Torr. In a preferred embodiment, the pressure varies inversely with deposition time. That is, the lower the pressure within process chamber 12, the longer the deposition time.

Inside process chamber 12, deposition takes place by flowing the deposition gases through the chamber. According to one embodiment of the present invention, the particular gases used are $SiH_4$, $PH_3$ and $H_2$. Other chemistries are possible. For example, $Si_2H_6$ could be used as the silicon source. Theses gases are flowed through process chamber 12 at volumes sufficient to cause polycrystalline silicon to deposit on the substrate.

By manipulating susceptor temperature, chamber pressure and gas flow, the nucleation and growth kinetics are controlled so that the process results in rough polycrystalline silicon. That is, under the temperature, pressure and gas flow conditions specified below, deposition occurs predominantly through surface phase nucleation and subsequent growth. If conditions are not properly adjusted nucleation and growth might not result in rough polycrystalline silicon. For example, if the temperature is too high, too much growth may occur and thus cause the nucleated grains to coalesce resulting in a smoother surface. Similarly, too low a temperature may give rise to too many nucleation sites which also detracts from roughness.

When deposition is completed, the substrate is transferred to cooling chamber 23 for cooling. When the substrate has reached about room temperature, it is transferred to loadlock chamber 11 and removed from single wafer reactor 10.

Figure 3A:
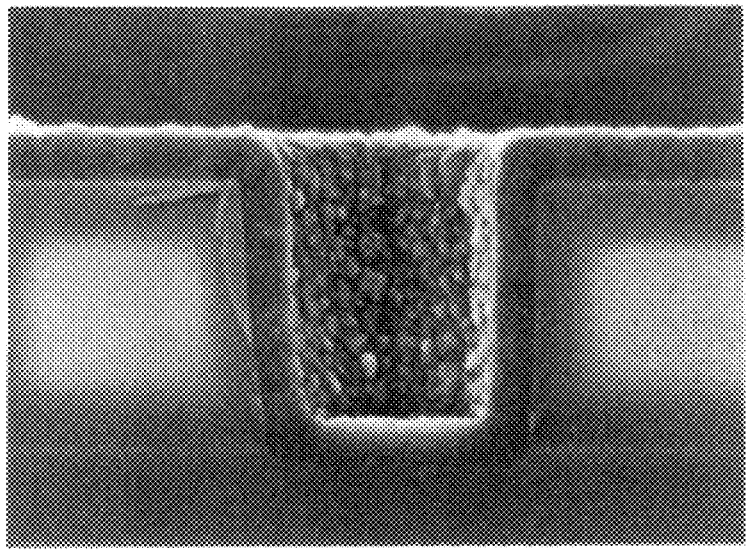
FIGS. 3a–3c are SEM images of rough polycrystalline deposited on a silicon wafer using a method according to one embodiment of the present invention.
Figure 3B:
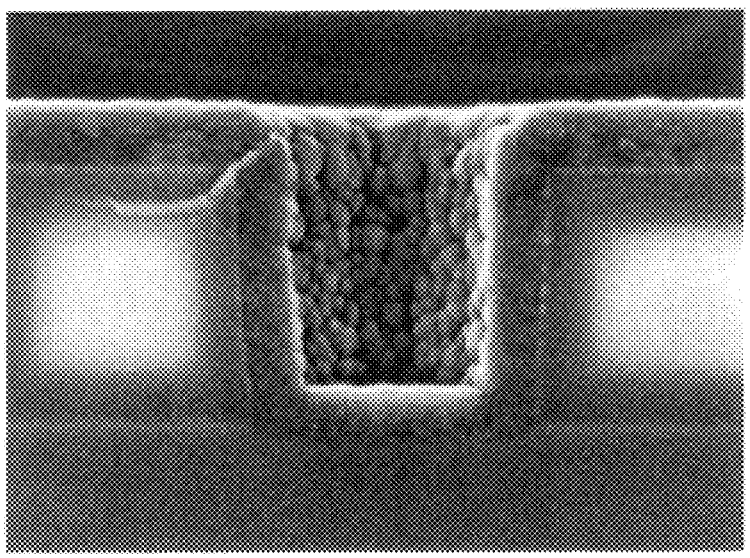
Figure 3C:
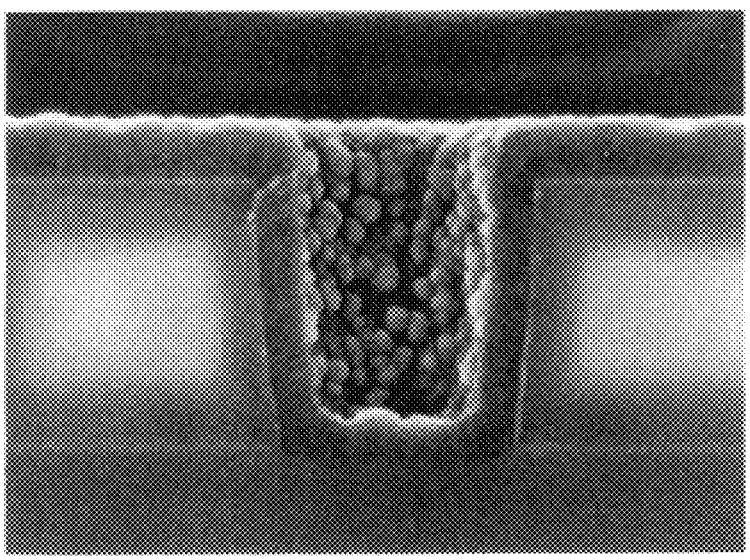

The efficacy of the method of fabricating in-situ doped, rough polycrystalline silicon using a single wafer reactor according to the embodiments of the present invention is illustrated by the following example. Three separate depositions were performed using a silicon wafer having a trench thereon as a substrate. The trench is used to simulate the formation of a single crown storage cell structure which has been proposed for use in high density DRAM. The deposition results are shown in FIGS. 3a–3c. FIGS. 3a–3c are SEM images of three silicon wafers upon which rough polycrystalline silicon was deposited using a single wafer reactor. The deposition conditions for the three wafers are summarized in the following table:

| Figure | Susceptor Temperature | Pressure | SiH$_4$ Gas Flow (cc/min) | PH$_3$ Gas Flow (cc/min) | H$_2$ Gas Flow (l/min) | Deposition Time |
|---|---|---|---|---|---|---|
| 3a | 668° C. | 20 Torr | 320 | 4 | 9 | 190 sec. |
| 3b | 668° C. | 40 Torr | 300 | 4 | 9 | 170 sec. |
| 3c | 668° C. | 40 Torr | 160 | 2 | 9 | 140 sec. |

As can be seen from FIGS. 3, each of the above depositions resulted in rough polycrystalline silicon with the degree of roughness varying depending on the deposition conditions.

Although the present invention has been described in detail, it should be understood that various changes, substitutions and alterations can be made thereto without departing from the spirit and scope of the invention as described by the appended claims.

What is claimed is:

1. A method for forming rugged polycrystalline silicon comprising:

providing a single wafer processing tool with a loadlock chamber, a processing chamber at a first pressure, heating lamps in the processing chamber; a transfer arm, and a cooling chamber;

loading a silicon substrate into the loadlock chamber;

reducing the pressure in the loadlock chamber to a pressure below atmospheric pressure;

raising the pressure in the loadlock chamber to a first pressure;

transferring the silicon substrate into the processing chamber using the transfer arm;

flowing SiH$_4$ in the processing chamber;

flowing PH$_3$ in the processing chamber;

flowing H$_2$ in the processing chamber;

maintaining chamber pressure to between 20 torr and about 40 torr; and heating the silicon substrate to between 648° C. and 688° C. using the heating lamps in the processing chamber to form a layer of rugged polycrystalline silicon.

2. The method of claim 1 wherein flowing SiH$_4$ in the processing chamber comprises a SiH$_4$ flow rate of 320 cc/m simultaneously with the flowing of PH$_3$ and H$_2$.

3. The method of claim 2 wherein flowing PH$_3$ in the processing chamber comprises a PH$_3$ flow rate of 4 cc/m.

4. The method of claim 3 wherein flowing H$_2$ in the processing chamber comprises a H$_2$ flow rate of 9 l/m.

* * * * *